(12) United States Patent
Mukae et al.

(10) Patent No.: US 8,436,513 B2
(45) Date of Patent: May 7, 2013

(54) DRIVE UNIT

(75) Inventors: Hideaki Mukae, Hyogo (JP); Eiichi Nagaoka, Hyogo (JP); Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 291 days.

(21) Appl. No.: 13/079,042

(22) Filed: Apr. 4, 2011

(65) Prior Publication Data

US 2011/0241487 A1    Oct. 6, 2011

(30) Foreign Application Priority Data

Apr. 6, 2010  (JP) .................................. 2010-088114
Jul. 15, 2010 (JP) .................................. 2010-160817

(51) Int. Cl.
*H02N 2/04* (2006.01)

(52) U.S. Cl.
USPC ................... 310/323.02; 310/323.14; 310/328

(58) Field of Classification Search .............. 310/323.03, 310/323.14, 328
See application file for complete search history.

(56) References Cited

U.S. PATENT DOCUMENTS

| | | | |
|---|---|---|---|
| 6,218,767 B1 | 4/2001 | Akada et al. | |
| 7,199,506 B2 * | 4/2007 | Sasaki et al. | .................. 310/328 |
| 7,834,518 B2 * | 11/2010 | Wischnewskij et al. | . 310/323.13 |
| 2006/0043824 A1 * | 3/2006 | Sakano et al. | .......... 310/323.09 |
| 2008/0145042 A1 * | 6/2008 | Kawai et al. | .................... 396/55 |
| 2011/0018394 A1 * | 1/2011 | Mukae | ..................... 310/323.02 |
| 2011/0037348 A1 | 2/2011 | Sakamoto | |

FOREIGN PATENT DOCUMENTS

| | | |
|---|---|---|
| JP | 06-105570 | 4/1994 |
| JP | 07-264880 | 10/1995 |
| JP | 09-191670 | 7/1997 |
| JP | 10-080166 | 3/1998 |
| JP | 10-323061 | 12/1998 |
| JP | 2000-134961 | 5/2000 |
| JP | 2006-067712 | 3/2006 |
| JP | 2008-148425 | 6/2008 |
| JP | 2008-172995 | 7/2008 |
| JP | 2009-268237 | 11/2009 |

* cited by examiner

*Primary Examiner* — Thomas Dougherty
*Assistant Examiner* — Bryan Gordon
(74) *Attorney, Agent, or Firm* — Renner, Otto, Boisselle & Sklar, LLP

(57) ABSTRACT

A drive unit includes: a shaft; a movable body supported by the shaft so as to be displaceable along the shaft; a vibratory actuator configured to drive the movable body; and a support body configured to support the vibrator actuator. The vibratory actuator includes an actuator main body that contacts the movable body and is configured to vibrate to output a driving force to the movable body, an opposing member that contacts the movable body and is positioned so as to face the actuator main body with the movable body interposed therebetween, and a coupling member that is configured to couple the actuator main body with the opposing member and to bias the actuator main body and the opposing member so as to sandwich the movable body therebetween with the movable body kept displaceable along the shaft. The support body supports the vibratory actuator so that the vibratory actuator is displaceable along a biasing direction of the coupling member.

13 Claims, 10 Drawing Sheets

DRIVE UNIT

CROSS-REFERENCE TO RELATED APPLICATION

This application claims priority to Japanese Patent Application No. 2010-088114 filed on Apr. 6, 2010 and Japanese Patent Application No. 2010-160817 filed on Jul. 15, 2010, the disclosure of which including the specifications, the drawings, and the claims is hereby incorporated by reference in its entirety.

BACKGROUND

A technique disclosed herein relates to drive units including a vibratory actuator and a support body configured to support the vibratory actuator, or drive units configured to drive a movable body, which is supported by a shaft, by using a vibratory actuator.

Drive units using a vibratory actuator are conventionally known in the art. For example, a drive unit described in Japanese Patent Publication No. 2006-067712 outputs a driving force by vibrating vibratory actuators formed by piezoelectric elements. Specifically, the drive unit of Japanese Patent Publication No. 2006-067712 includes two vibratory actuators provided with driver elements, and a shaft is held between the driver elements of the two vibratory actuators. By vibrating the vibratory actuators in this state, the driver elements are displaced according to the vibration of the vibratory actuators, whereby the shaft is driven in the axial direction thereof.

The tip end of the shaft is coupled with a lens frame of a lens unit. Specifically, a pin extending radially from the shaft is provided at the tip end of the shaft, whereas a long hole extending parallel to the shaft is provided in the lens frame. The pin at the tip end of the shaft is fitted in the long hole of the lens frame. The pin fitted in the long hole is pressed against one longitudinal end of the long hole by a plate spring, and is substantially fixed thereto, whereby displacement of the shaft in the axial direction thereof can be transmitted to the lens frame. Note that the width of the long hole is slightly greater than the outer diameter of the pin. That is, the pin is displaceable in the lateral direction of the long hole, and displacement of the pin in the lateral direction of the long hole is absorbed so as not to be transmitted to the lens frame.

Drive units configured to drive a movable body, which is supported by a shaft, by using a vibratory actuator are also conventionally known in the art. For example, a drive unit described in Japanese Patent Publication No. 2008-148425 includes a movable body formed as a rectangular frame, a shaft extending parallel to one side of the movable body and configured to support the movable body, and a vibratory actuator configured to drive the movable body along the shaft. The movable body has two through holes. Bearings are provided in these through holes, and the shaft is inserted through the bearings. The vibratory actuator has a vibrator provided inside the frame-shaped movable body. The vibrator is biased toward the movable body so as to contact the movable body. The vibrator is vibrated in this state to move the movable body along the shaft.

SUMMARY

Every structure has shape errors, attachment errors, etc., and various measures have been taken against such errors. In the drive unit of Japanese Patent Publication No. 2006-067712, a gap is provided between the pin and the long hole to absorb such shape errors and attachment errors. However, this drive unit has problems such as a significant loss of the driving force and slow response, because a plurality of members, such as the shaft and the pin, are present between the vibratory actuator and the lens frame. Moreover, since the gap configured to absorb the errors is provided between the pin and the long hole in a transmission path of the driving force, the loss of the driving force and the response time are further increased.

The technique disclosed herein was developed in view of the above problems, and it is a first object of the present disclosure to enable shape errors and attachment errors to be absorbed without degrading the capability of a vibratory actuator.

The vibratory actuator transmits a driving force to the movable body via friction. That is, the vibrator needs to be biased toward the movable body in order to efficiently transmit the driving force to the movable body. However, increasing the biasing force may deform the movable body. The shaft is normally inserted through the bearing portions so as to be smoothly slidable therein. However, if the bearing portion is deformed by the biasing force, the frictional resistance between the bearing portion and the shaft is increased, which hinders smooth driving of the movable body.

The technique disclosed herein was developed in view of the above problems, and it is a second object of the present disclosure to reduce the frictional resistance increased due to deformation of a bearing portion.

A drive unit for achieving the first object includes: a shaft; a movable body supported by the shaft so as to be displaceable along the shaft; a vibratory actuator configured to drive the movable body; and a support body configured to support the vibrator actuator. The vibratory actuator includes an actuator main body that contacts the movable body and is configured to vibrate to output a driving force to the movable body, an opposing member that contacts the movable body and is positioned so as to face the actuator main body with the movable body interposed therebetween, and a coupling member that is configured to couple the actuator main body with the opposing member and to bias the actuator main body and the opposing member so as to sandwich the movable body therebetween with the movable body kept displaceable along the shaft. The support body supports the vibratory actuator so that the vibratory actuator is displaceable along a biasing direction of the coupling member.

In the above drive device, the actuator main body is brought into direct contact with the movable body, and the movable body is pressed and sandwiched between the actuator main body and the opposing member, whereby the driving force from the actuator main body can be efficiently transmitted to the movable body. Moreover, since the vibratory actuator is supported by the support body so as to be displaceable in the biasing direction, a shift in position in the biasing direction due to shape errors and attachment errors can be absorbed. This can reduce the unevenness of the pressing force, applied to the shaft, of the actuator main body and the opposing member, whereby the driving force of the actuator main body can be efficiently transmitted to the movable body.

A drive unit for achieving the second object includes: a shaft; a movable body supported by the shaft so as to be displaceable along the shaft; and a vibratory actuator including an actuator main body that is configured to be biased so as to contact the movable body, and is configured to vibrate to output a driving force to the movable body. The movable body includes a main body having a through hole formed therein, and a bearing portion provided at least at an end of the through hole and configured to receive the shaft therethrough. The bearing portion has a higher elastic modulus than the main body of the movable body.

The above drive device can reduce deformation of the bearing portion, and can reduce the frictional resistance between the shaft and the bearing portion increased due to the deformation.

DETAILED DESCRIPTION

Example embodiments will be described in detail below with reference to the accompanying drawings.

Embodiment

Figure 1:
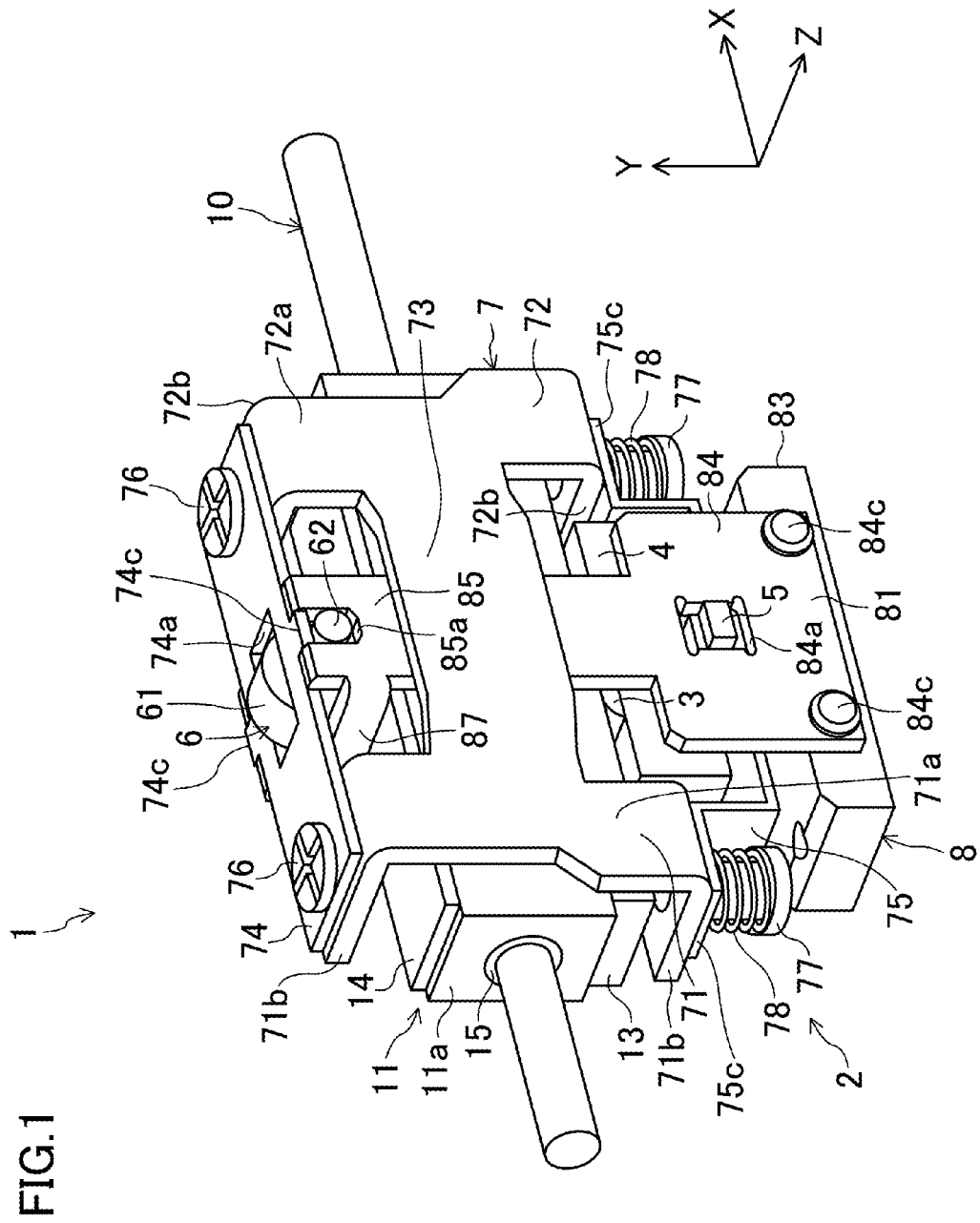
FIG. 1 is a perspective view of a drive unit according to an embodiment.
Figure 2:
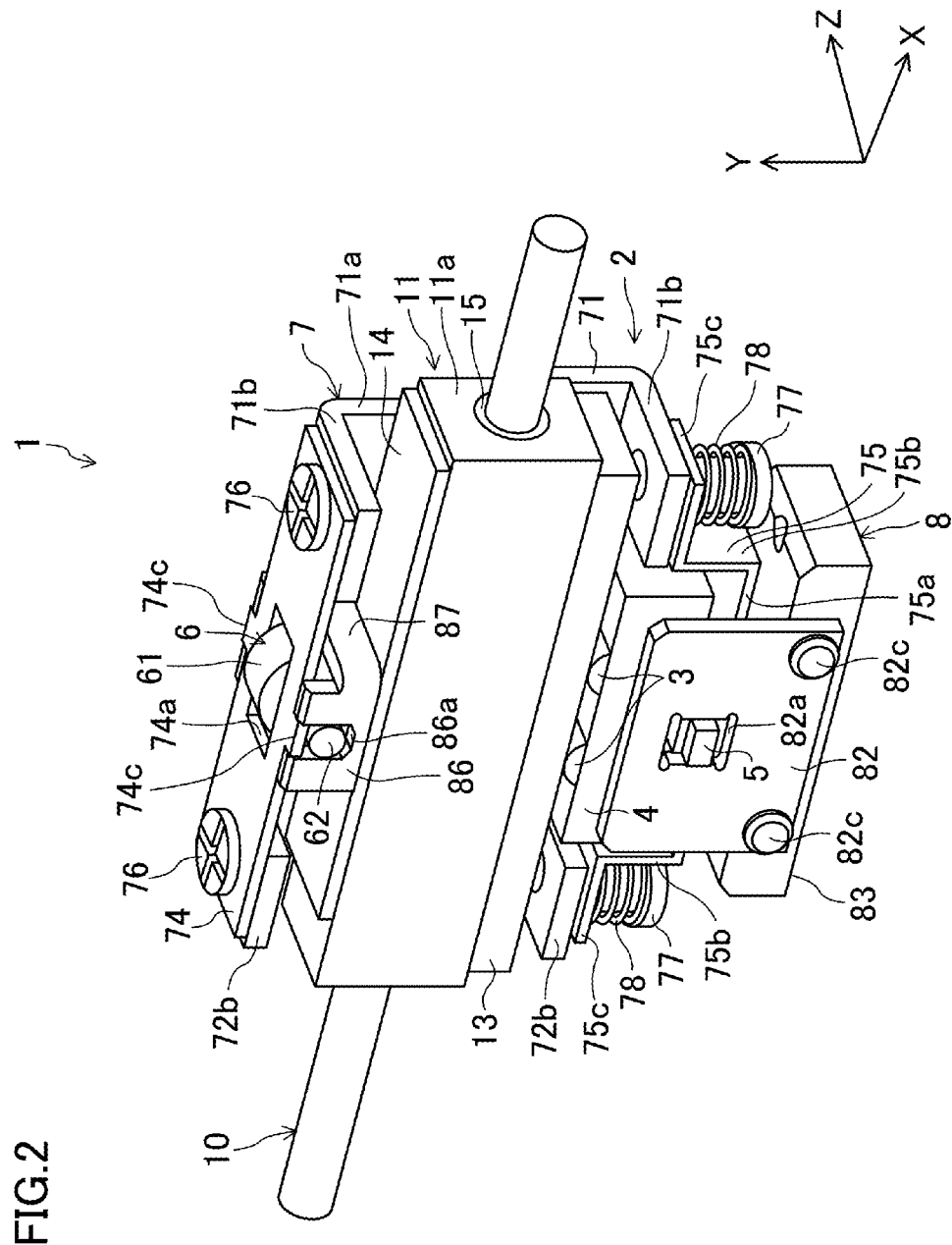
FIG. 2 is a perspective view of the drive unit as viewed from a different angle from FIG. 1.
Figure 3:
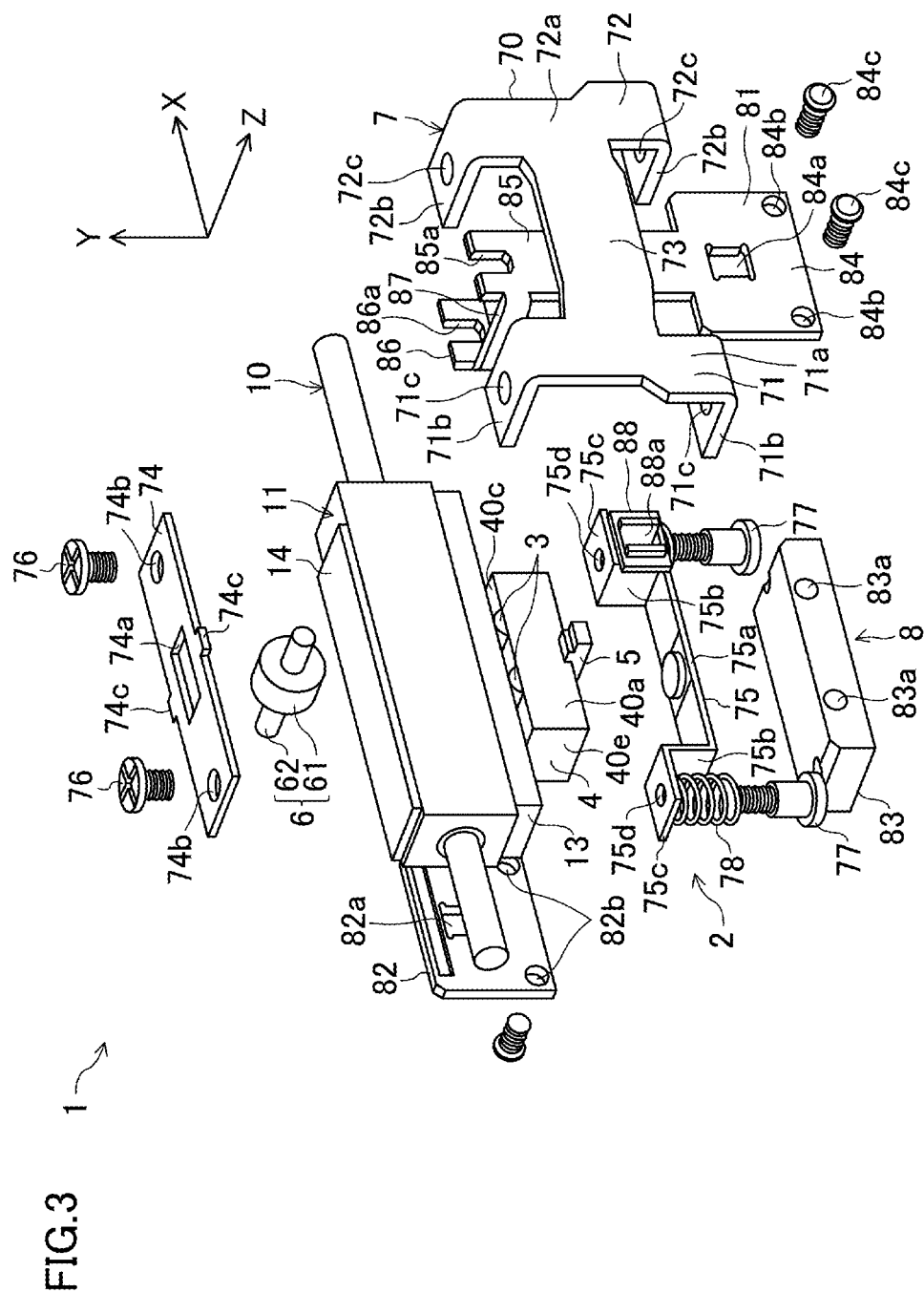
FIG. 3 is an exploded perspective view of the drive unit.

FIG. 1 is a perspective view of a drive unit according to an embodiment, FIG. 2 is a perspective view as viewed from a different angle from FIG. 1, and FIG. 3 is an exploded perspective view of the drive unit. As shown in FIGS. 1-3, a drive unit 1 of the embodiment includes: a shaft 10 fixed to a base (not shown); a movable body 11 slidably provided on the shaft 10; an ultrasonic actuator 2 configured to drive the movable body 11; a support body 8 fixed with respect to the base, and configured to support the ultrasonic actuator 2 with respect to the base; and a control unit (not shown) for driving and controlling the ultrasonic actuator 2.

The movable body 11 has a main body 11a being in the shape of a quadrangular prism and having a through hole 11b (shown only in FIGS. 10A-10B) penetrating therethrough in the axial direction thereof, bearing portions 15 (only one of which is shown in FIGS. 1-3) provided at both ends of the through hole 11b, a first slide plate 13 that is contacted by an actuator main body 4 described later, and a second slide plate 14 that is contacted by a roller 6 described later. The bearing portions 15 are press fitted in the through hole 11b, or are bonded and fixed to the through hole 11b. The shaft 10 is inserted through the bearing portions 15. Thus, the movable body 11 is slidable along the axial direction (the X-axis direction in the figure) of the shaft 10. The direction in which the shaft 10 extends is the movable direction of the movable body 11. As will be described in detail later, the movable body 11 receives a driving force generated by the ultrasonic actuator 2, and moves along the shaft 10 accordingly.

The main body 11a of the movable body 11 is made of a polycarbonate containing glass fiber. Common polycarbonates containing glass fiber have a Young's modulus of 3.4 to 8.8 GPa. The bearing portions 15 are made of a metal, and have a Young's modulus of 54 GPa. That is, the bearing portions 15 have a higher Young's modulus, namely a higher elastic modulus, than the main body 11a of the movable body 11.

The first slide plate 13 is made of alumina, and is bonded and fixed to one (the lower face in FIGS. 1-3) of the four side faces of the main body 11a of the movable body 11. The second slide plate 14 is made of alumina, and is bonded and fixed to another one of the four side faces of the main body 11a, which is opposite to the side face having the first slide plate 13 thereon. The first and second slide plates 13, 14 have a higher elastic modulus than the main body 11a of the movable body 11. Alumina has a Young's modulus of about 250 to 400 GPa. The first slide plate 13 forms a first slide member, and the second slide plate 14 forms a second slide member. Note that the first and second slide plates 13, 14 may have the same elastic modulus or different elastic moduli. The material of the first and second slide plates 13, 14 is not limited to the aforementioned material, and any material may be used for the first and second slide plates 13, 14.

The configuration of the ultrasonic actuator 2 will be described below. The ultrasonic actuator 2 includes: the actuator main body 4 configured to be biased so as to contact the movable body 11, and configured to vibrate to output a driving force to the movable body 11; a holder 5 configured to hold the actuator main body 4; the roller 6 configured to, together with the actuator main body 4, hold the movable body 1 therebetween; and a coupling member 7 configured to elastically couple the actuator main body 4 with the roller 6. The ultrasonic actuator 2 forms a vibratory actuator.

The actuator main body 4 is formed by a piezoelectric element. The actuator main body 4 is substantially in the shape of a rectangular parallelepiped having a pair of substantially rectangular principal faces 40a (only one of which is shown in FIG. 3) facing each other, a pair of longer side faces 40c (only one of which is shown in FIG. 3) facing each other, and a pair of shorter side faces 40e (only one of which is shown in FIG. 3) facing each other. The pair of longer side faces 40c are perpendicular to the principal faces 40a, and extend in the longitudinal direction of the principal faces 40a. The pair of shorter side faces 40e are perpendicular to both the principal faces 40a and the longer side faces 40c, and extend in the lateral direction of the principal faces 40a. The actuator main body 4 is provided with driver elements 3, 3 configured to transmit the driving force of the actuator main body 4 to the movable body 11.

Figure 4:
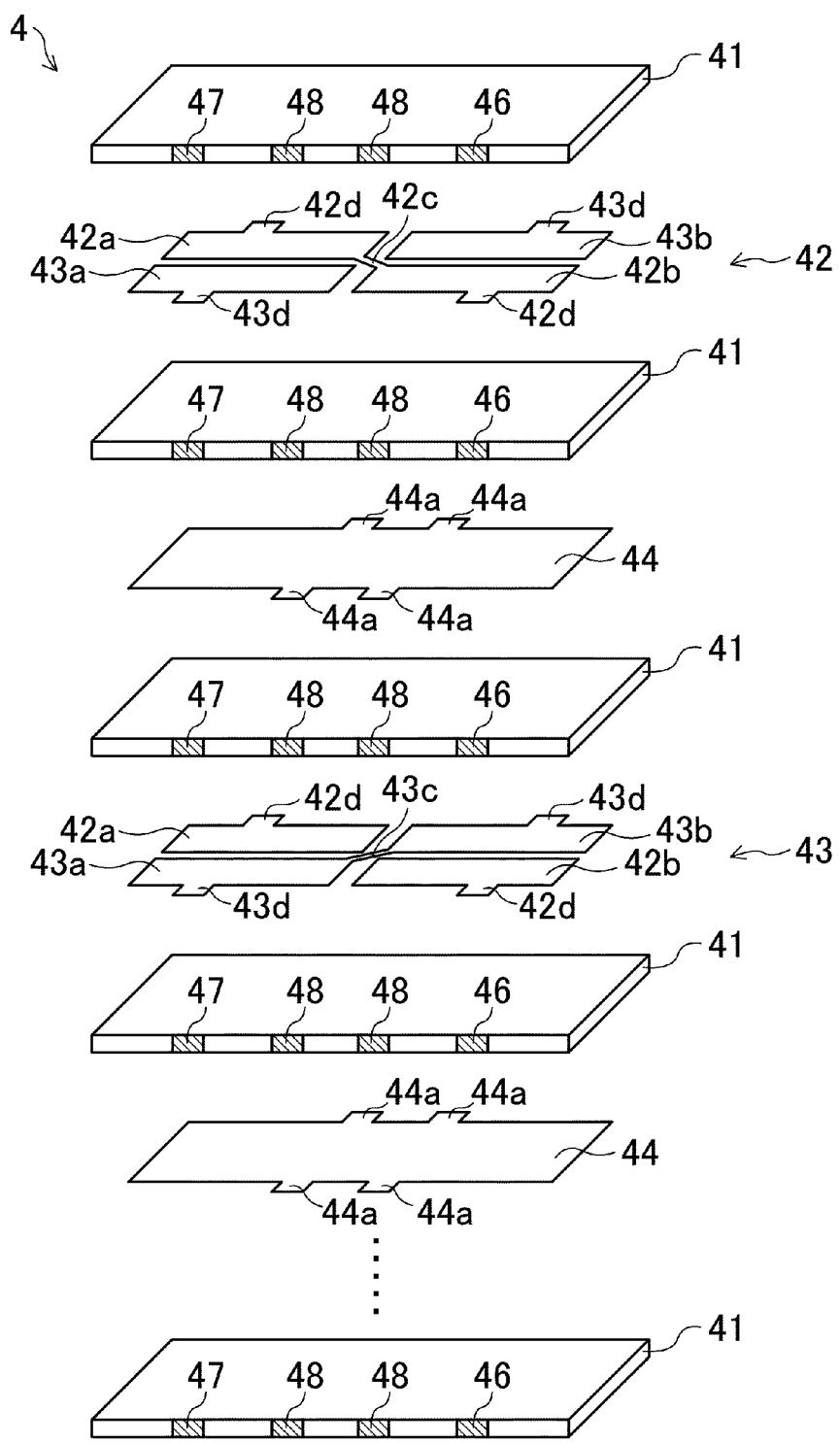
FIG. 4 is an exploded perspective view of a piezoelectric element unit.

FIG. 4 is an exploded perspective view of the actuator main body 4. As shown in FIG. 4, the actuator main body 4 is formed by alternately stacking piezoelectric element layers (piezoelectric elements) 41, 41, . . . and internal electrode layers 42, 44, 43, 44. The internal electrode layers 42, 44, 43, 44 include a first power-supply electrode layer 42, a common electrode layer 44, a second power-supply electrode layer 43, and another common electrode layer 44, which are arranged alternately with the piezoelectric element layers 41 in the stacking direction. A plurality of sets of the first power-supply electrode layer 42, the common electrode layer 44, the second power-supply electrode layer 43, and the common electrode layer 44, namely a plurality of sets of the internal electrode layers 42, 44, 43, 44, are repeatedly stacked together with each of the piezoelectric element layers 41 interposed between adjoining ones of the internal electrode layers 42, 44, 43, 44. Note that the piezoelectric element layers 41, 41 are located at both ends in the stacking direction. Each of the first power-supply electrode layer 42, the second power-supply electrode layer 43, and the common electrode layers 44 is printed on a principal face of a corresponding one of the piezoelectric element layers 41.

The piezoelectric element layers 41 are insulator layers made of, e.g., a ceramic material such as lead zirconate titanate. Like the actuator main body 4, each of the piezoelectric element layers 41 is substantially in the shape of a rectangular parallelepiped having a pair of principal faces, a pair of longer side faces, and a pair of shorter side faces. Each of the piezoelectric element layers 41 has first and second external electrodes 46, 47 and two common external electrodes 48, 48 on each of the longer side faces. The first and second external electrodes 46, 47 are formed at both longitudinal ends of each longer side face of each piezoelectric element layer 41, and the two common external electrodes 48, 48 are formed at positions located inside the first and second external electrodes 46, 47 in the longitudinal direction. That is, on each longer side face of each piezoelectric element layer 41, the first external electrode 46, the common external electrode 48, the common external electrode 48, and the second external electrode 47 are sequentially arranged in this order in the longitudinal direction so as to be separated from each other.

Each of the common electrode layers 44 has a substantially rectangular shape, and is provided over substantially the entire principal faces of the piezoelectric element layers 41. Each of the common electrode layers 44 has extraction electrodes 44a, 44a extending from each of the longer side portions of the common electrode layer 44 to the common external electrodes 48, 48 formed on the longer side faces of the piezoelectric element layers 41.

Figure 5:
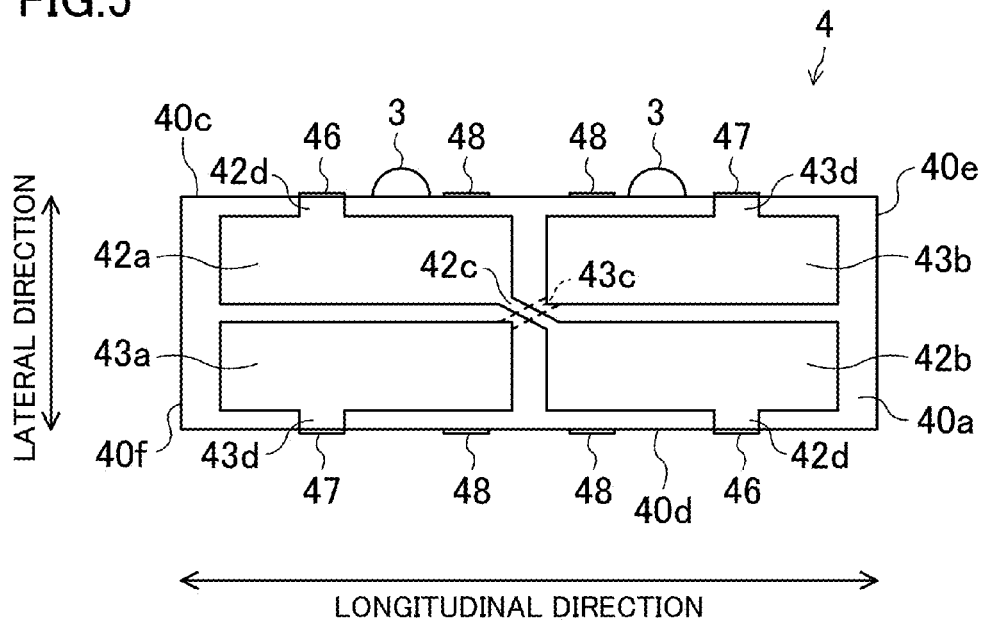
FIG. 5 is a schematic front view showing a schematic configuration of an actuator main body.

As shown in FIG. 5, each of the first and second power-supply electrode layers 42, 43 has a pair of first electrodes 42a, 42b and a pair of second electrodes 43a, 43b. Of four regions of the principal face of each piezoelectric element layer 41 defined by dividing the principal face in half both in the longitudinal and lateral directions, the pair of first electrodes 42a, 42b are formed in one of two pairs of diagonally opposite regions of the principal face, and the pair of second electrodes 43a, 43b are formed in the other pair of diagonally opposite regions. The first electrodes 42a, 42b and the second electrodes 43a, 43b face the common electrode layers 44 with a corresponding one of the piezoelectric element layers 41 interposed therebetween. Extraction electrodes 42d, 42d are formed so as to extend from the first electrodes 42a, 42b to the first external electrodes 46, 46 formed on the loner side faces of the piezoelectric element layers 41 and adjoining the first electrodes 42a, 42a. Extraction electrodes 43d, 43d are formed so as to extend from the second electrodes 43a, 43b to the second external electrodes 47, 47 formed on the loner side faces of the piezoelectric element layers 41 and adjoining the second electrodes 43a, 43a. In the first power-supply electrode layer 42, the first electrodes 42a, 42b are electrically connected together via a first conductive electrode 42c. In the second power-supply electrode layer 43, the second electrodes 43a, 43b are electrically connected together via a second conductive electrode 43c.

In the actuator main body 4 formed by alternately stacking the piezoelectric element layers 41, 41, . . . and the internal electrode layers 42, 44, 43, 44, the common external electrodes 48, 48 of the piezoelectric element layers 41 are aligned in the stacking direction in each of the loner side faces 40c, 40d to form single external electrodes 48. The extraction electrodes 44a, 44a of the common electrode layers 44, 44 are electrically connected to the external electrodes 48. Thus, the common electrode layers 44, 44, . . . provided on the different piezoelectric element layers 41, 41, . . . are electrically connected together via the common external electrodes 48, 48.

Similarly, in the actuator main body 4, the first external electrodes 46 of the piezoelectric element layers 41 are aligned in the stacking direction on each of the longer side faces 40c, 40d to form single first external electrodes 46. The second external electrodes 47 of the piezoelectric element layers 41 are also aligned in the stacking direction on each of the longer side faces 40c, 40d to form single second external electrodes 47. The extraction electrodes 42d, 42d from the first electrodes 42a, 42b are electrically connected to the first external electrodes 46, 46. The extraction electrodes 43d, 43d from the second electrodes 43a, 43b are electrically connected to the second external electrodes 47, 47. Thus, the first electrodes 42a, 42b are electrically connected to the first electrodes 42a, 42b provided on the different piezoelectric element layers 41, 41, . . . via the first conductive electrodes 42c and the first external electrodes 46, 46. The second electrodes 43a, 43b are electrically connected to the second electrodes 43a, 43b provided on the different piezoelectric element layers 41, 41, . . . via the second conductive electrodes 43c and the second external electrodes 47, 47. Signal lines from the control unit are connected to the external electrodes 46, 47, 48. The actuator main body 4 is supplied with power via the external electrodes 46, 47, 48.

The two driver elements 3, 3 are provided on one longer side face 40c (that is, one of the pair of faces facing the vibration direction of bending vibration described later; hereinafter also referred to as the "installation face") of the actuator main body 4.

The driver elements 3, 3 are columnar members with a semicircular cross section, and are made of zirconia, alumina, silicon nitride, silicon carbide, tungsten carbide, etc. The driver elements 3, 3 are arranged so that their axes extend along the thickness direction of the actuator main body 4. The driver elements 3, 3 are bonded to the installation face 40c via an adhesive so as to be in surface contact therewith.

The driver elements 3, 3 provided on the installation face 40c are located at a distance of 30-35% of the entire length of the installation face 40c inward from both longitudinal ends of the actuator main body 4. That is, the positions of the driver elements 3, 3 correspond to antinodes of a second-order mode of bending vibration, described later, of the actuator main body 4, and correspond to the points of maximum vibration.

In the actuator main body 4 thus configured, the external electrodes 48 are connected to the ground, and alternating current (AC) voltages having a predetermined frequency and having a phase difference of 90° therebetween are applied to the first and second external electrodes 46, 47. Thus, the AC voltages having a phase difference of 90° therebetween are applied to the first electrodes 42a, 42b located in one of the pairs of diagonally opposite regions of the principal face of the piezoelectric element layer 41, and to the second electrodes 43a, 43b located in the other pair of diagonally opposite regions, thereby inducing in the actuator main body 4 stretching vibration in the longitudinal direction thereof (so-called "longitudinal vibration") and bending vibration in the lateral direction thereof (so-called "lateral vibration").

Figure 6:
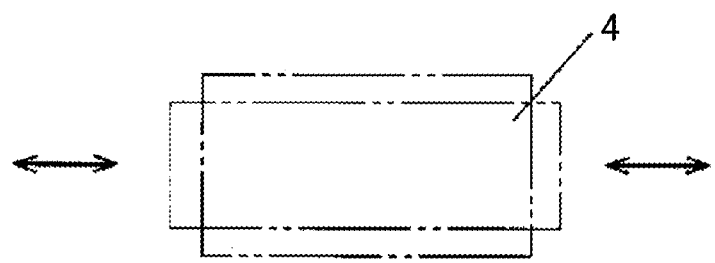
FIG. 6 is a conceptual diagram showing displacement of the actuator main body in the longitudinal direction caused by a first-order mode of longitudinal vibration.
Figure 7:
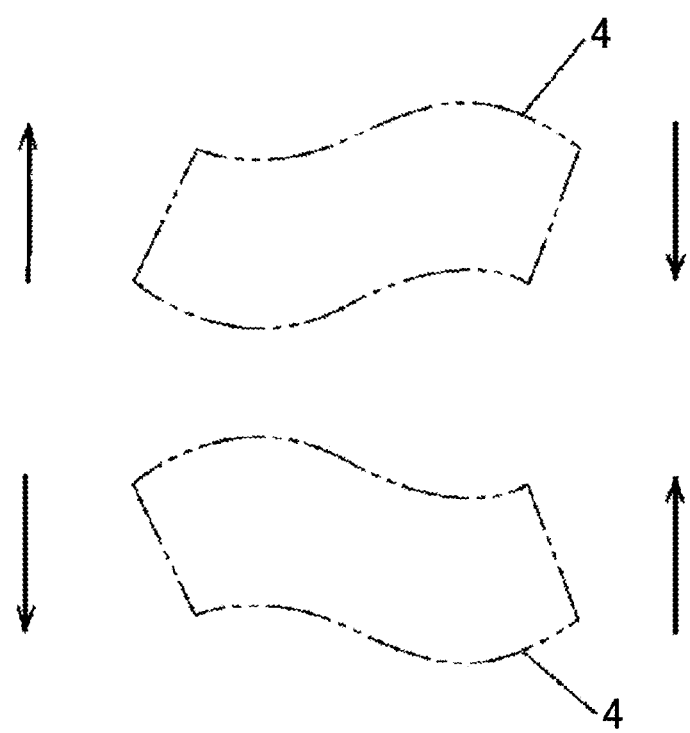
FIG. 7 is a conceptual diagram showing displacement of the actuator main body caused by a second-order mode of bending vibration.
Figure 8A:
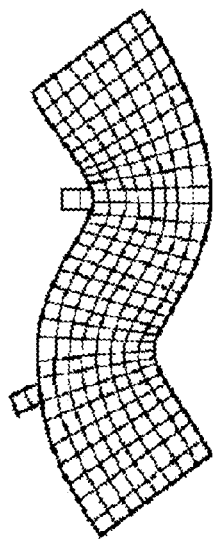
FIGS. 8A-8D are conceptual diagrams showing operation of the actuator main body.
Figure 8B:
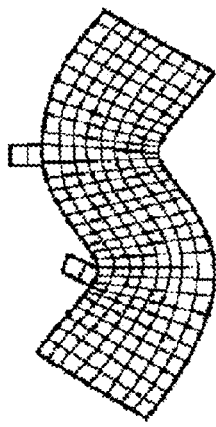
Figure 8C:
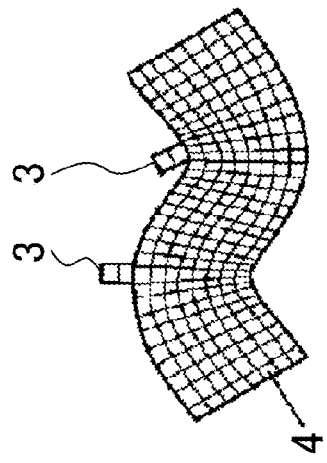
Figure 8D:
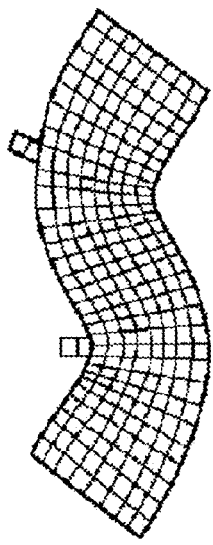

The resonant frequency of stretching vibration and the resonant frequency of bending vibration are determined by the actuator main body 4, namely by the material, shape, etc. of the actuator main body 4. These resonant frequencies are also affected by the force supporting the actuator main body 4, and the supported portions of the actuator main body 4. In view of the above, these resonant frequencies are made substantially equal to each other, and AC voltages having a frequency close to this resonant frequency and having a phase difference of 90° therebetween are applied to the first and second external electrodes 46, 47. For example, the shape, etc. of the actuator main body 4 are designed so that the first-order mode of stretching vibration (see FIG. 6) has the same resonant frequency as the second-order mode of bending vibration (see FIG. 7), and the AC voltages having a frequency close to this resonant frequency and having a phase difference of 90° therebetween are applied as described above. This harmonically induces the first-order mode of stretching vibration and the second-order mode of bending vibration in the actuator main body 4, whereby the shape of the actuator main body 4 changes sequentially as shown in FIGS. 8A-8D.

As a result, the driver elements 3 provided on the actuator main body 4 move in a substantially elliptical path, that is, in an orbital path, in a plane parallel to the principal faces of the actuator main body 4 (a plane parallel to the plane of the paper of FIG. 7), namely in a plane including the longitudinal and lateral directions (i.e., a plane including the vibration directions of stretching vibration and bending vibration).

The actuator main body 4 thus configured is placed so that the driver elements 3, 3 contact the first slide plate 13 of the movable body 11.

The holder 5 is a member in the shape of a quadrangular prism, which is made of a polycarbonate (containing glass fiber). The holder 5 is provided on the longer side face of the actuator main body 4 having no driver elements 3, 3 thereon. The holder 5 is attached to this longer side face of the actuator main body 4 so as to extend in the thickness direction (i.e., the stacking direction) of the actuator main body 4 at the longitudinal center of the actuator main body 4. Both ends of the holder 5 protrude beyond both principal faces of the actuator main body 4 in the thickness direction.

The roller 6 has a roller main body 61 and a roller shaft 62. The roller main body 61 is rotatably attached to the roller shaft 62 via a ball bearing. The roller 6 forms an opposing member. The roller 6 contacts the movable body 11, and is positioned so as to face the actuator main body 4 with the movable body 11 interposed therebetween.

The coupling member 7 has a coupling member main body 70, a pressing plate 74 attached to the coupling member main body 70 to press the roller 6 against the movable body 11, and a plate spring 75 attached to the coupling member main body 70 to press the actuator main body 4 against the movable body 11. The coupling member 7 couples the actuator main body 4 with the roller 6, and biases the actuator main body 4 and the roller 6 so as to sandwich the movable body 11 therebetween with the movable body kept displaceable along the shaft.

The coupling member main body 70 has first and second coupling portions 71, 72 extending parallel to each other in the lateral direction of the actuator main body 4, and a third coupling portion 73 extending in the longitudinal direction of the actuator main body 4 to couple the first and second coupling portions 71, 72 together.

The first coupling portion 71 has a flat main body portion 71a extending in the lateral direction of the actuator main body 4, and attachment portions 71b, 71b that are bent substantially perpendicularly to the main body portion 71a from both ends of the main body portion 71a. The second coupling portion 72 has a shape similar to that of the first coupling portion 71, and has a main body portion 72a and attachment portions 72b, 72b. The attachment portions 71b, 72b have tapped holes 71c, 72c (shown only in FIG. 3) penetrating therethrough. One of the attachment portions 71b, 71b of the first coupling portion 71 and one of the attachment portions 72b, 72b of the second coupling portion 72 face the second slide plate 14 of the movable body 11, and the other attachment portion 71b of the first coupling portion 71 and the other attachment portion 72b of the second coupling portion 72 face the first slide plate 13 of the movable body 11. The third coupling portion 73 couples the main body portion 71a of the first coupling portion 71 with the main body portion 72a of the second coupling portion 72. The third coupling portion 73 does not extend on the same plane as the main body portion 71a of the first coupling portion 71 and the main body portion 72a of the second coupling portion 72, but protrudes beyond the main body portions 71a, 72a to the side opposite to the attachment portions 71b, 72b. The first to third coupling portions 71-73 are formed as an integral part by bending a flat plate, and have an overall "H" shape.

The pressing plate 74 is formed by a substantially rectangular flat plate. The pressing plate 74 has a rectangular through hole 74a formed in the longitudinal center thereof, and has circular insertion holes 74b, 74b (shown only in FIG. 3) formed at both longitudinal ends thereof so as to penetrate therethrough. The pressing plate 74 is screwed on those attachment portions 71b, 72b of the first and second coupling portions 71, 72 which face the second slide plate 14. Specifically, screws 76, 76 inserted through the insertion holes 74b, 74b of the pressing plate 74 are tightened into the tapped hole 71c of the attachment portion 71b and the tapped hole 72c of the attachment portion 72b to attach the pressing plate 74 to the first and second coupling portions 71, 72. Note that the pressing plate 74 may be formed integrally with the first and second coupling portions 71, 72.

At this time, the roller 6 is held between the pressing plate 74 and the movable body 11. Specifically, the roller main body 61 is located in the through hole 74a of the pressing plate 74, and protrudes beyond the through hole 74a. At this time, the roller shaft 62 of the roller 6 contacts the pressing plate 74, and is pressed toward the movable body 11 by the pressing plate 74. Thus, the roller main body 61 is pressed against the second slide plate 14 of the movable body 11. Note that protrusions 74c, 74c protruding in the lateral direction of the pressing plate 74 are provided at the longitudinal centers of the longer sides of the pressing plate 74.

The plate spring 75 is formed by bending a sheet metal. Specifically, the plate spring 75 has a bottom plate portion 75a extending parallel to the longer side faces of the actuator main body 4, standing plate portions 75b, 75b standing from both ends of the bottom plate portion 75a and extending parallel to the shorter side faces of the actuator main body 4, and flange portions 75c, 75c extending outward from the tip ends of the standing plate portions 75b, 75b and parallel to the bottom plate portion 75a. The plate spring 75 has an overall "U" shape so as to cover from the outside the longer side face of the actuator main body 4 having the holder 5 thereon, and the two shorter side faces thereof. Each flange portion 75c has an insertion hole 75d penetrating therethrough, and configured to receive therethrough a screw described later.

The plate spring 75 is screwed on those attachment portions 71b, 72b of the first and second coupling portions 71, 72 which face the first slide plate 13. Specifically, stepped screws 77, 77 inserted through the insertion holes 75d, 75d of the plate spring 75 are tightened into the tapped hole 71c of the attachment portion 71b and the tapped hole 72c of the attachment portion 72b to attach the plate spring 75 to the first and second coupling portions 71, 72. At this time, coiled springs 78 are fitted on the stepped screws 77. Each of the coiled springs 78 is held between the head of the stepped screw 77 and the plate spring 75, and is compressively deformed. The actuator main body 4 is contained and held between the plate spring 75 thus attached to the coupling member 7 and the movable body 11. Specifically, the bottom plate portion 75a of the plate spring 75 contacts the holder 5 provided on the actuator main body 4. Thus, the elastic force of the compressively deformed coiled springs 78 biases the actuator main body 4 toward the movable body 11 via the plate spring 75 and the holder 5, whereby the actuator main body 4 presses the first slide plate 13 of the movable body 11. That is, the plate spring 75, the stepped screws 77, and the coiled springs 78 function as a biasing portion.

In addition, the elastic force of the coiled springs 78 is also transmitted to the coupling member 7 via the stepped screws 77, and further to the roller 6 via the coupling member 7 and the pressing plate 74. That is, the elastic force of the coiled springs 78 biases the roller 6 toward the movable body 11, whereby the roller 6 presses the second slide plate 14 of the movable body 11.

Thus, in the ultrasonic actuator 2, the actuator main body 4 and the roller 6, which are coupled together by the coupling member 7, press the movable body 11 while holding the movable body 11 therebetween. Thus, a frictional force according to the elastic force of the coiled springs 78 is generated between the driver elements 3, 3 of the actuator main body 4 and the movable body 11, whereby a driving force that is output from the driver elements 3, 3 can be efficiently transmitted to the movable body 11. Although the driver elements 3, 3 are pressed against the movable body 11 in this configuration, the movable body 11 is also pressed from the side opposite to the driver elements 3, 3 by the roller 6 with a pressing force approximately equal to that of the driver elements 3, 3. Thus, these pressing forces applied to the movable body 11 cancel each other. This can reduce an unwanted force unevenly applied to the shaft 10, whereby the movable body 11 can be smoothly moved.

The configuration of the support body 8 will be described below. The support body 8 has first and second support plates 81, 82 configured to support the actuator main body 4, and a base member 83 to which the first and second support plates 81, 82 are attached and which is fixed to the base.

The base member 83 is a block-shaped member, and is screwed to the base. The base member 83 has tapped holes 83a, 83a (only two of which are shown in FIG. 3) for attaching the first and second support plates 81, 82 to the base member 83.

The first support plate 81 is formed by a bent plate-like member. The first support plate 81 has a rectangular base end portion 84, an extended portion 85 extending from the base end portion 84, an opposing guide portion 86 provided so as to face the tip end of the extended portion 85, and a coupling portion 87 coupling the extended portion 85 with the opposing guide portion 86.

An opening 84a is formed in the center of the base end portion 84 so as to penetrate therethrough in the thickness direction. A guide member 88 (only one is shown in FIG. 3) configured to support the holder 5 is provided at the opening 84a. The guide member 88 is bonded and fixed to the base end portion 84. The guide member 88 has a guide hole 88a in the form of a long hole. The guide hole 88a penetrates through the guide member 88, and extends in the direction in which the actuator main body 4 is biased toward the movable body 11 (that is, the lateral direction of the actuator main body 4, the Y-axis direction in the figure). The width of the guide hole 88a is slightly greater than that of the holder 5. An end of the holder 5, which protrudes beyond the actuator main body 4 in the thickness direction thereof, is inserted through the guide hole 88a. The end of the holder 5 is slidable in the guide hole 88a in the direction in which the guide hole 88a extends. The guide member 88 is made of a material having a lower elastic modulus and lower hardness than the base end portion 84. Moreover, the guide member 88 is made of a material that is softer than the holder 5 and is highly slidable on a resin material, etc. For example, the guide member 88 is made of polyacetal. Note that the guide hole 88a may be a bottomed hole rather than a through hole penetrating through the guide member 88, depending on the amount by which the holder 5 protrudes beyond the actuator main body 4. The base end portion 84 has insertion holes 84b penetrating therethrough. The insertion holes 84b are formed at two of the four corners of the base end portion 84, which are located at both ends of the side opposite to the side having the extended portion 85. The first support plate 81 is attached to the base member 83 by inserting screws 84c, 84c through the insertion holes 84b, 84b, and tightening the screws 84c, 84c into the tapped holes 83a, 83a of the base member 83.

The extended portion 85 extends from one side of the base end portion 84 in the same direction as that in which the guide hole 88a extends. A cutout as a guide groove 85a is formed at the tip end of the extended portion 85. That is, the extended portion 85 has a bifurcated or "U"-shaped tip end. The direction in which the guide groove 85a extends corresponds with the direction in which the guide hole 88a of the base end portion 84 extends. That is, the guide groove 85a and the guide hole 88a are aligned in a line.

Like the tip end of the extended portion 85, a cutout as a guide groove 86a is formed in the opposing guide portion 86, and thus the opposing guide portion 86 is formed as a bifurcated or "U"-shaped portion. The opposing guide portion 86 is coupled with the tip end of the extended portion 85 via the coupling portion 87 so as to face the tip end of the extended portion 85.

The guide grooves 85a, 86a have a width slightly greater than the outer diameter of the roller shaft 62 of the roller 6 so that the roller shaft 62 fits therein. The guide grooves 85a, 86a are configured so that not only the roller shaft 62 but also the protrusions 74c, 74c of the pressing plate 74 fit therein.

The second support plate 82 is formed by a substantially rectangular flat plate-like member. An opening 82a is formed substantially in the center of the second support plate 82 so as to penetrate through the second support plate 82 in the thickness direction. A guide member (not shown) configured to support the holder 5 is provided in the opening 82a. The guide member has the same configuration as the guide member 88 of the first support plate 81. That is, the guide member has a guide hole in the form of a long hole. The guide hole penetrates through the guide member, and extends in the direction in which the actuator main body 4 is biased toward the movable body 11. The guide hole has a substantially rectangular shape extending in the lateral direction of the actuator main body 4. Another end of the holder 5, which protrudes beyond the actuator main body 4 in the thickness direction thereof, is inserted through the guide hole. The width of the guide hole is slightly greater than that of the holder 5. The end of the holder 5 is slidable in the guide hole in the direction in which the guide hole extends. The second support plate 82 has insertion holes 82b, 82b penetrating therethrough. The insertion holes 82b, 82b are formed at two of the four corners of the second support plate 82, which are located at both ends of one longer side thereof. The second support plate 82 is attached to the base member 83 by inserting screws 82c, 82c through the insertion holes 82b, 82b, and tightening the screws 82c, 82c into the tapped holes 83a, 83a of the base member 83. When the second support plate 82 is attached to the base member 83, the guide hole of the guide member provided at the opening 82a and the guide groove 86a of the opposing guide portion 86 of the first support plate 81 are aligned in a line.

Thus, the support body 8 supports the holder 5 of the ultrasonic actuator 2 by the guide holes 88a of the first and second support plates 81, 82, and supports the roller shaft 62 of the ultrasonic actuator 2 by the guide grooves 85a, 86a of the first support plate 81. The first and second support plates 81, 82 form a guide portion, the guide holes 88a form a long hole, the guide grooves 85a, 86a form a groove, and the holder 5 and the roller shaft 62 form an engaging portion.

The guide holes 88a, which are configured to fit the holder 5 therein, and the guide grooves 85a, 86a, which are configured to fit the roller shaft 62 therein, are aligned in a line as viewed in the thickness direction of the actuator main body 4. Thus, the contact portion between the roller 6 and the movable body 11 is located at an intermediate position between the contact portions between the two driver elements 3, 3 and the movable body 11, in the axial direction of the shaft 10. That is, the pressing force for sandwiching the movable body 11 between the roller 6 and the actuator main body 4 is applied symmetrically with respect to the line passing through the contact portion between the roller 6 and the movable body 11 and extending in the direction in which the movable body 11 is sandwiched between the roller 6 and the actuator main body 4 (that is, the lateral direction of the actuator main body 4).

The operation of the drive unit 1 thus configured is controlled by the control unit. Specifically, the control unit receives an operation command from the outside, and applies AC voltages, having a frequency and a phase difference according to the operation command, to the first and second external electrodes 46, 47. Thus, the control unit harmonically generates stretching vibration and bending vibration in the actuator main body 4, thereby causing the driver elements 3, 3 to move in an orbital path as shown in FIGS. 8A-8D. At this time, the driver elements 3, 3 have been biased toward the movable body 11 by the coupling member 7, and a sufficient frictional force has been applied between the driver elements 3, 3 and the movable body 11. As a result, the movable body 11 is driven along the shaft 10 via the frictional force. Note that the roller 6 is in contact with the second slide plate 14 of the movable body 11 with a frictional force approximately equal to that of the driver elements 3, 3. However, since the roller main body 61 rotates via the ball bearing, the roller 6 does not hinder the movement of the movable body 11.

Note that the control unit applies to the first and second external electrodes 46, 47 AC voltages having a frequency slightly higher than the common resonant frequency of stretching vibration and bending vibration of the actuator main body 4 in order to reduce abnormal heat generation of the actuator main body 4. The AC voltages that are applied to the first and second external electrodes 46, 47 have a phase difference of 90° therebetween.

Driving of the movable body 11 will be described in more detail below. When the driver elements 3, 3 move in a substantially elliptical path, the frictional force between the driver elements 3, 3 and the first slide plate 13 of the movable body 11 increases and decreases periodically and repeatedly. At this time, the driving force in the longitudinal direction of the actuator main body 4 is transmitted to the movable body 11 via the frictional force, and the movable body 11 moves along the shaft 10. The longitudinal direction of the actuator main body 4 (which is the same as the direction in which the shaft 10 extends) corresponds to the driving direction that is the direction in which the driver elements 3, 3 output the driving force. Note that a reaction force in the direction opposite to that of the driving force in the longitudinal direction is applied from the movable body 11 to the actuator main body 4. However, since the holder 5 attached to the actuator main body 4 is engaged with the guide holes 88a, the reaction force is received by the first and second support plates 81, 82, which enables the actuator main body 4 to properly output the driving force to the movable body 11.

Figure 9A:
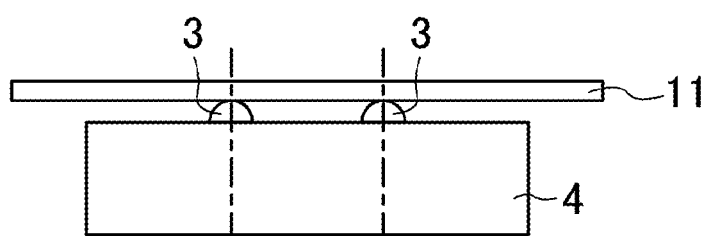
FIG. 9A is a conceptual diagram illustrating driving of a stage by an ultrasonic actuator, and showing the state before driving.
Figure 9B:
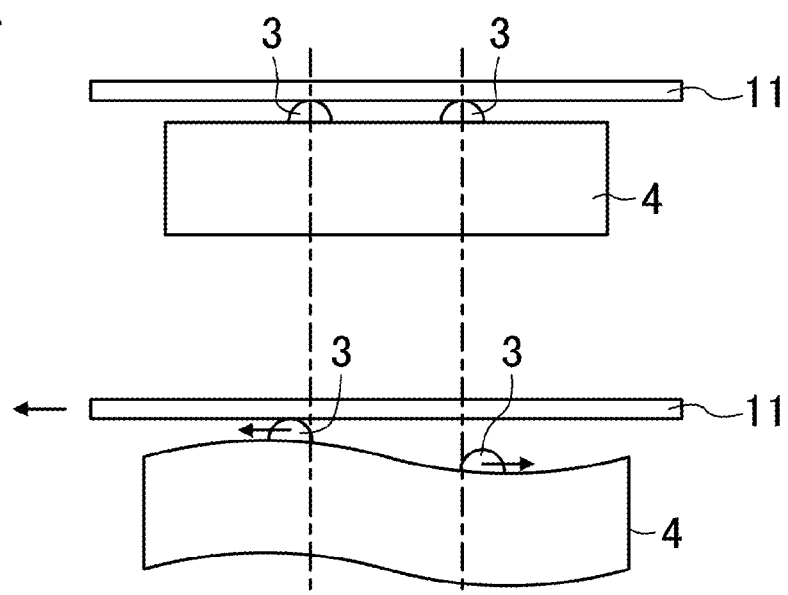
FIG. 9B is a conceptual diagram illustrating driving of the stage by the ultrasonic actuator, and showing the state where the actuator main body stretches in the longitudinal direction, and the stage is driven by one of driver elements.

More specifically, as shown in FIG. 9B, when the actuator main body 4 stretches in the longitudinal direction (the vibration direction of stretching vibration), one of the driver elements 3, 3 (e.g., the one located on the left side in FIGS. 9A-9C) is displaced while increasing the frictional force with the movable body 11 to a value larger than that before driving (i.e., the frictional force generated when the ultrasonic actuator 2 is merely installed). This increased frictional force moves the movable body 11 to the side (the left side in FIGS. 9A-9C) to which the one driver element 3 is displaced in the longitudinal direction. At this time, the other driver element 3 (located on the right side in FIGS. 9A-9C) is displaced in the direction opposite to that of the one driver element 3 in the longitudinal direction. However, the other driver element 3 is displaced in the state where it is separated from the movable body 11, or is displaced while reducing the frictional force with the movable body 11 to a value smaller than that before driving. Thus, the other driver element 3 hardly affects the movement of the movable body 11.

Figure 9C:
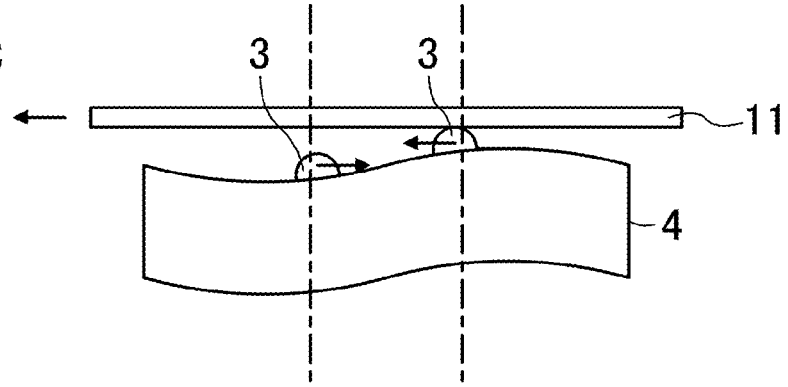
FIG. 9C is a conceptual diagram illustrating driving of the stage by the ultrasonic actuator, and showing the state where the actuator main body contracts in the longitudinal direction, and the stage is driven by the other driver element.

On the other hand, as shown in FIG. 9C, when the actuator main body 4 contracts in the longitudinal direction, the other driver element 3 (located on the right side in FIGS. 9A-9C) is displaced while increasing the frictional force with the movable body 11 to a value larger than that before driving (that is, the frictional force generated when the ultrasonic actuator 2 is merely installed). This increased frictional force moves the movable body 11 to the side (the left side in FIGS. 9A-9C) to which the other driver element 3 is displaced in the longitudinal direction. The direction in which the movable body 11 is moved is the same as that in which the movable body 11 is moved by the one driver element 3 when the actuator main body 4 stretches as described above. At this time, the one driver element 3 (located on the left side in FIGS. 9A-9C) is displaced in the direction opposite to that of the other driver element 3 in the longitudinal direction. However, the one driver element 3 is displaced in the state where it is separated from the movable body 11, or is displaced while reducing the frictional force with the movable body 11 to a value smaller than that before driving. Thus, the one driver element 3 hardly affects the movement of the movable body 11.

Note that in FIGS. 9A-9C, the driver element 3 that does not affect the movement of the movable body 11 is separated from the movable body 11. However, this driver element 3 need not necessarily be separated from the movable body 11. That is, this driver element 3 may be in contact with the movable body 11 with a frictional force that is not large enough to move the movable body 11.

Thus, one of the driver elements 3 and the other driver element 3 alternately move the movable body 11 in one predetermined direction with a phase difference of 180° therebetween. Note that applying the AC voltages having a phase difference of −90° therebetween to the first and second electrodes 46, 47 can reverse the direction of the driving force that is output from the driver elements 3, 3, and thus can move the movable body 11 in another direction.

Assembly of the drive unit 1 will be described below.

First, the pressing plate 74 is attached to the coupling member main body 70 by the screws 76, 76. The roller shaft 62 of the roller 6 is fitted into the guide grooves 85a, 86a of the first support plate 81. Since the width of the guide grooves 85a, 86a is slightly greater than the outer diameter of the roller shaft 62, the roller shaft 62 is capable of moving freely in the direction in which the guide grooves 85a, 86a extend. Then, the first support plate 81 is fixed to the base member 83 by the screws 84c, 84c. The coupling member main body 70 and the first support plate 81 are fixed to a jig so as to have the positional relationship of the finished assembly. At this time, the protrusions 74c, 74c of the pressing plate 74 are fitted into the guide grooves 85a, 86a of the first support plate 81, and the pressing plate 74 is fixed to the coupling member main body 70 by the screws 76, 76.

Then, one end of the holder 5 fixed to the actuator main body 4 is inserted through the guide hole 88a of the first support plate 81. At this time, the actuator main body 4 is positioned so that the driver elements 3, 3 face the roller 6. The plate spring 75 is positioned on the side of the actuator main body 4 having the holder 5 thereon. Thereafter, the other end of the holder 5 is inserted through the guide hole of the second support plate 82, and the second support plate 82 is fixed to the base member 83 via the screws 82c, 82c.

Subsequently, the movable body 11 is positioned between the actuator main body 4 and the roller 6 so that the first slide plate 13 faces the driver elements 3, 3. Then, the plate spring 75 is attached to the coupling member main body 70 via the stepped screws 77 having the coiled springs 78 fitted thereon. At this time, the coiled springs 78 are compressively deformed. The elastic force of the coiled springs 78 is transmitted to the actuator main body 4 via the plate spring 75. As a result, the actuator main body 4 is biased (pressed) toward the movable body 11. This elastic force of the coiled springs 78 does not only act on the actuator main body 4, but also acts as a reaction force on the coupling member main body 70. The reaction force of the coiled springs 78 biases (presses) the roller 6 toward the movable body 11 via the coupling member main body 70. Thus, with the movable body 11 being sandwiched between the actuator main body 4 and the roller 6, the movable body 11 is pressed in the sandwiching direction (i.e., the direction in which the actuator main body 4 and the roller 6 move toward each other). This configuration can ensure a sufficient frictional force between the actuator main body 4 and the movable body 11, whereby the driving force of the actuator main body 4 can be efficiently transmitted to the movable body 11. Note that the biasing forces of the actuator main body 4 and the roller 6, namely the frictional force between the actuator main body 4 and the movable body 11, can be adjusted by the amount of compression of the coiled springs 78.

The ultrasonic actuator 2 thus configured is supported by the support body 8 so as to be displaceable in the direction in which the actuator main body 4 and the roller 6 are biased toward the movable body 11 (i.e., the direction in which the movable body 11 is sandwiched between the actuator main body 4 and the roller 6, the Y-axis direction in the figure). Specifically, the holder 5 attached to the actuator main body 4 is movable in the guide holes 88a in the biasing direction, and the roller shaft 62 of the roller 6 is movable in the guide grooves 85a, 86a in the biasing direction. Thus, even if the positions of the ultrasonic actuator 2 and the movable body 11 are shifted relative to each other in the biasing direction due to shape errors and attachment errors of the shaft 10, the movable body 11, the ultrasonic actuator 2, and the support body 8, the ultrasonic actuator 2 is displaced in the biasing direction, whereby the shift in position can be absorbed.

If the ultrasonic actuator 2 is not displaceable in the biasing direction, an imbalance is caused between the pressing force that is applied from the actuator main body 4 to the movable body 11 and the pressing force that is applied from the roller 6 to the movable body 11 when the positions of the ultrasonic actuator 2 and the movable body 11 are shifted relative to each other in the biasing direction. As a result, an unwanted force is applied to the shaft 10, which degrades the slidability of the movable body 11 along the shaft 10, and thus hinders efficient driving of the movable body 11.

On the other hand, in the present embodiment, the ultrasonic actuator 2 is displaceable in the biasing direction. Thus, if the positions of the ultrasonic actuator 2 and the movable body 11 are shifted relative to each other in the biasing direction, the ultrasonic actuator 2 moves in the biasing direction so that the pressing force that is applied from the actuator main body 4 to the movable body 11 becomes equal to the pressing force that is applied from the roller 6 to the movable body 11. That is, the position of the ultrasonic actuator 2 in the biasing direction is automatically adjusted to balance the pressing force that is applied from the actuator main body 4 to the movable body 11 with the pressing force that is applied from the roller 6 to the movable body 11. As a result, the actuator main body 4 can be pressed against the movable body 11 without applying any unwanted force to the shaft 10, whereby the driving force of the actuator main body 4 can be efficiently transmitted to the movable body 11.

The guide holes 88a of the first and second support plates 81, 82 function not only to guide the actuator main body 4 in the biasing direction, but also to restrict displacement of the actuator main body 4 in the axial direction of the shaft 10 (i.e., the longitudinal direction of the actuator main body 4). That is, the actuator main body 4 outputs to the movable body 11 a driving force along the axial direction of the shaft 10, and at the same time receives from the movable body 11 a reaction force in the opposite direction along the axial direction of the shaft 10. This reaction force tries to displace the actuator main body 4 in the direction opposite to that of the movable body 11 along the axial direction of the shaft 10. However, the holder 5 is fitted in the guide holes 88a of the first and second support plates 81, 82, thereby restricting the displacement of the actuator main body 4 in the axial direction of the shaft 10. As a result, the driving force that is output from the actuator main body 4 can be properly transmitted to the movable body 11.

Moreover, the holder 5 is fitted in the guide holes 88a of the first and second support plates 81, 82 so as to be displaceable in the direction perpendicular to both the axial direction of the shaft 10 and the biasing direction of the coupling member 7 (that is, in the thickness direction of the actuator main body 4, the Z-axis direction in the figure; hereinafter referred to as the "perpendicular direction"). The roller shaft 62 is fitted in the guide grooves 85a, 86a of the first support plate 81 so as to be displaceable in the perpendicular direction. That is, the ultrasonic actuator 2 is supported by the support body 8 so as to be displaceable in the perpendicular direction. Thus, even if the positions of the ultrasonic actuator 2 and the movable body 11 are shifted relative to each other in the perpendicular direction due to shape errors and attachment errors, the ultrasonic actuator 2 is displaced in the perpendicular direction with respect to the support body 8, whereby the shift in position can be absorbed. As a result, the actuator main body 4 can be pressed against the movable body 11 without applying any unwanted force to the shaft 10, whereby the driving force of the actuator main body 4 can be efficiently transmitted to the movable body 11.

The actuator main body 4 and the roller 6 sandwich the movable body 11 therebetween in the biasing direction, but are displaceable with respect to the movable body 11 in a plane that is perpendicular to the biasing direction. Thus, the shift in position of the ultrasonic actuator 2 and the movable body 11 in the perpendicular direction can also be absorbed by displacement of the actuator main body 4 and the roller 6 in the perpendicular direction in the plane perpendicular to the biasing direction.

Note that the movable body 11 is movable in the axial direction of the shaft 10. Thus, even if the positions of the ultrasonic actuator 2 and the movable body 11 are shifted relative to each other in the axial direction due to shape errors and attachment errors, the shift in position in the axial direction can be absorbed by movement of the movable body 11 along the shaft 10.

Since the guide holes 88a for fitting the holder 5 therein and the guide grooves 85a, 86a for fitting the roller shaft 62 therein are in the shape of a long hole extending in the biasing direction, the ultrasonic actuator 2 is rotatable about the axis of the shaft 10. Thus, even if the positions of the ultrasonic actuator 2 and the movable body 11 are shifted relative to each other in the rotation direction about the axis of the shaft 10 due to shape errors and attachment errors, the ultrasonic actuator 2 rotates about the axis with respect to the support body 8, whereby the shift in position can be absorbed.

Moreover, although the guide holes 88a restrict the displacement of the holder 5 in the axial direction of the shaft 10, a gap large enough to allow the holder 5 to be displaced along the guide hole 88a is provided between each guide hole 88a and the holder 5. Similarly, although the guide grooves 85a, 86a restrict the displacement of the roller shaft 62 in the axial direction of the shaft 10, a gap large enough to allow the roller shaft 62 to be displaced along the guide groove 85a, 86a is provided between each guide groove 85a, 86a and the roller shaft 62. Thus, even with the holder 5 being fitted in the guide holes 88a, and with the roller shaft 62 being fitted in the guide grooves 85a, 86a, the ultrasonic actuator 2 is rotatable about the axis along the perpendicular direction. Accordingly, even if the positions of the ultrasonic actuator 2 and the movable body 11 are shifted relative to each other in the rotation direction about the axis due to shape errors and attachment errors, the ultrasonic actuator 2 rotates about the axis with respect to the support body 8, whereby the shift in position can be absorbed.

As described above, the actuator main body 4 and the roller 6 sandwich the movable body 11 therebetween in the biasing direction, but are displaceable with respect to the movable body 11 in the plane perpendicular to the biasing direction. Thus, even if the positions of the ultrasonic actuator 2 and the movable body 11 are shifted relative to each other in the rotation direction about the axis extending in the biasing direction due to shape errors and attachment errors, the ultrasonic actuator 2 rotates about the axis with respect to the movable body 11, whereby the shift in position can be absorbed.

In this configuration, the movable body 11 is driven by pressing the movable body 11 by the actuator main body 4 and the roller 6 in a balanced manner. However, the movable body 11 can be deformed since the pressing force is applied to the moving body 11. In particular, the axial ends of the movable body 11 tend to be deformed because they are free ends. That is, the movable body 11 tends to be deformed when it is moved relatively to a position where either one of the axial ends of the movable body 11 is sandwiched between the actuator main body 4 and the roller 6.

Figures 10A, 10B:
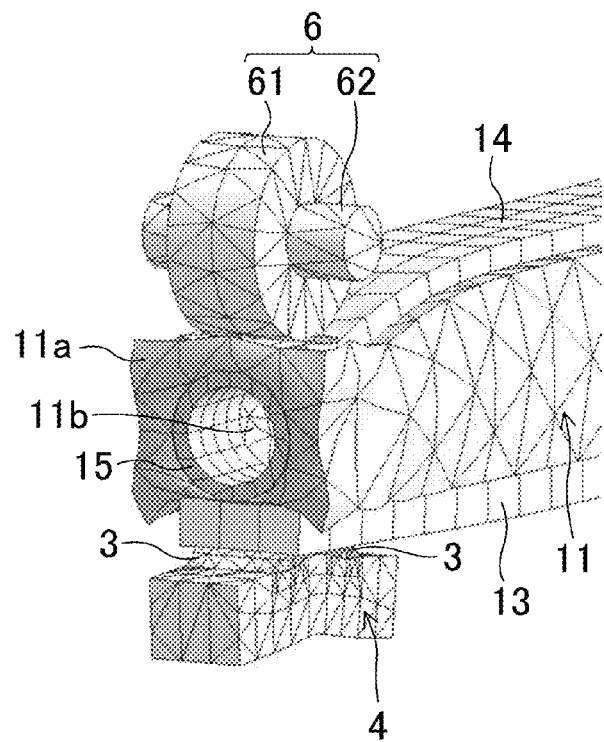
FIG. 10A is an enlarged perspective view of an end of a movable body in the case where a bearing portion has a higher elastic modulus than a main body of the movable body.
FIG. 10B is an enlarged perspective view of the end of the movable body in the case where the bearing portion has a lower elastic modulus than the main body of the movable body.

FIG. 10A shows the simulation result of deformation of the movable body 11 obtained by modeling the movable body 11, the actuator main body 4, and the roller 6 in the case where the elastic modulus of the bearing portion 15 is higher than that of the main body 11a of the movable body 11. FIG. 10B shows the simulation result of deformation of the movable body 11 obtained by modeling the movable body 11, the actuator main body 4, and the roller 6 in the case where the elastic modulus of the bearing portion 15 is equal to or lower than that of the main body 11a of the movable body 11.

As shown in FIG. 10B, the bearing portion 15 can be deformed if the elastic modulus of the bearing portion 15 is equal to or lower than that of the main body 11a of the movable body 11. If the bearing portion 15 is deformed, the frictional resistance between the bearing portion 15 and the shaft 10 increases, hindering smooth driving of the movable body 11.

Thus, in the movable body 11, the bearing portion 15 is provided at the ends of the through hole 11b of the main body 11a of the movable body 11, and the elastic modulus of the bearing portion 15 is made higher than that of the main body 11a of the movable body 11. In this case, as shown in FIG. 10A, the main body 11a of the movable body 11 is deformed to a greater extent than the bearing portion 15, and the amount of deformation of the bearing portion 15 can be reduced. This can reduce the frictional resistance, increased due to the deformation, between the bearing portion 15 and the shaft 10.

Thus, the ultrasonic actuator 2 is supported by the support body 8 so as to be translatable along three perpendicular axes, namely the biasing direction of the coupling member 7, the axial direction of the shaft 10, and the direction perpendicular to the biasing and axial directions, and so as to be rotatable about the three perpendicular axes. Thus, even if the positions of the ultrasonic actuator 2 and the movable body 11 are shifted relative to each other along the three perpendicular axes or in the rotation directions about the three perpendicular axes due to attachment errors and shape errors, the shift in position can be absorbed by the support structure for supporting the ultrasonic actuator 2 by the support body 8. As a result, although the movable body 11 is sandwiched and pressed by the actuator main body 4 and the roller 6 in the above configuration, the uneven force applied to the shaft 10 is reduced, whereby the movable body 11 can be driven efficiently.

Since the shift in position can be absorbed in this manner, high assembly accuracy is not required, whereby assembly of the drive unit 1 can be simplified.

In the present embodiment, the drive unit 1 includes the shaft 10, the movable body 11 supported by the shaft 10 so as to be displaceable along the shaft 10, and the vibratory actuator 2 having the actuator main body 4 that is configured to be biased so as to contact the movable body 11, and is configured to vibrate to output a driving force to the movable body 11. The movable body 11 has the main body 11a having the through hole 11b formed therein, and the bearing portions 15 which is provided at least at the ends of the through hole 11b, and through which the shaft 10 is inserted. The bearing portions 15 have a higher elastic modulus than the main body 11a of the movable body 11. According to this embodiment, the main body 11a of the movable body 11 is made to be more easily deformed than the bearing portions 15, whereby the deformation of the bearing portions 15 can be reduced. This can reduce the frictional resistance, increased due to the deformation, between the bearing portion 15 and the shaft 10, whereby smooth driving of the movable body 11 can be maintained.

In particular, in the configuration capable of pressing the movable body 11 from both sides in a balanced manner by the actuator main body 4 and the roller 6 as in the present embodiment, the movable body 11 is less likely to be displaced with respect to the shaft 10. Thus, the pressing force can be increased. This increases deformation of the movable body 11. However, as described above, providing the bearing portions 15 having a higher elastic modulus than the main body 11a of the movable body 11 reduces deformation of the bearing portions 15, which can reduce the frictional resistance, increased due to the deformation, between the bearing portion 15 and the shaft 10. That is, the configuration of the present embodiment is capable of efficiently transmitting the driving force while reducing the frictional resistance increased due to the deformation.

In the configuration in which the first and second slide plates 13, 14 are provided on the main body 11a of the movable body 11 as in the present embodiment, the entire main body 11a of the movable body 11 tends to be deformed. That is, if the first and second slide plates 13, 14 are not provided, the main body 11a may be locally deformed at locations contacted by the driver elements 3, 3 and the roller 6, and may not be deformed in the vicinity of the through hole 11b. However, if the first and second slide plates 13, 14 are provided, the pressing force of the actuator main body 4 and the roller 6 is transmitted to the entire main body 11a of the movable body 11 via the first and second slide plates 13, 14, causing deformation of the entire main body 11a of the movable body 11. In particular, if the first and second slide plates 13, 14 have a higher elastic modulus than the main body 11a of the movable body 11, the entire main body 11a of the movable body 11 is deformed rather than the first and second slide plates 13, 14 being locally deformed. As a result, the vicinity of the through hole 11b may also be deformed. However, as described above, providing the bearing portions 15 having a higher elastic modulus than the main body 11a of the movable body 11 can reduce deformation of the bearing portion 15, and thus reduce the frictional resistance, increased due to the deformation, between the bearing portion 15 and the shaft 10.

Other Embodiments

The above embodiment may be configured as described below.

Although the ultrasonic actuator 2 generates the first-order mode of stretching vibration and the second-order mode of bending vibration in the actuator main body 4, the present invention is not limited to this. An actuator main body that generates any mode of vibration can be used as long as it generates stretching vibration and bending vibration in the actuator main body 4.

Although two driver elements 3, 3 are provided on the longer side face 40c of the actuator main body 4, the present invention is not limited to this. For example, the driver elements may be provided on the shorter side face 40e of the actuator main body 4. In this case, the actuator main body 4 contacts the movable body 11 so that the shorter side face 40e of the actuator main body 4 faces the movable body 11. The actuator main body 4 outputs a driving force in the direction of bending vibration.

Figure 11:
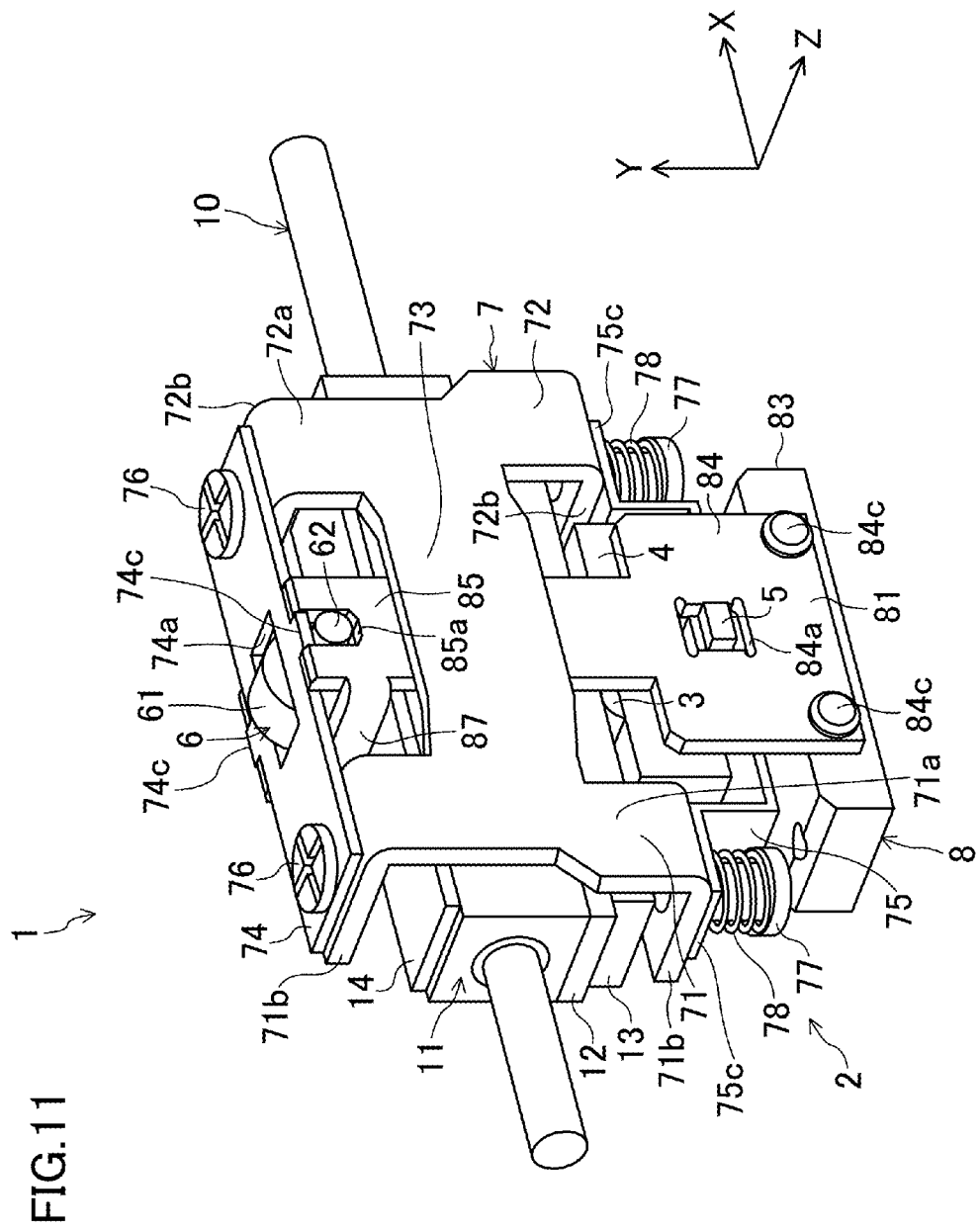
FIG. 11 is a perspective view of a drive unit according to another embodiment.

The movable body 11 may be configured as shown in FIG. 11. That is, the movable body 11 is in the shape of a quadrangular prism, and has an insertion hole penetrating therethrough in the axial direction. The shaft 10 is fitted in the insertion hole. Thus, the movable body 11 is configured to be slidable along the axial direction (the X-axis direction in the figure) of the shaft 10. The movable body 11 is movable in the direction in which the shaft 10 extends. A base plate 12 made of stainless steel is bonded and fixed to one (the lower face in FIG. 11) of the four side faces of the movable body 11 in order to increase the rigidity of the movable body 11, and a slide member 13 made of alumina is bonded and fixed to the surface of the base plate 12. Another slide member 14 made of alumina is provided on another one of the four side faces of the movable body 11, namely the one located opposite to the side face having the base plate 12 and the slide member 13 thereon. Note that the base plate 12 and the slide members 13, 14 may be omitted. The materials of the base plate 12 and the slide members 13, 14 are not limited to those described above, and any materials can be used. This movable body 11 receives a driving force generated by the ultrasonic actuator 2, and moves along the shaft 10 accordingly.

In the above embodiment, the holder 5 provided on the actuator main body 4 is supported by the guide holes 88a of the support body 8, and the roller shaft 62 of the roller 6 is supported by the guide grooves 85a, 86a of the support body 8. However, the support structure for supporting the ultrasonic actuator 2 by the support body 8 is not limited to this. For example, although the holder 5 is supported by the guide members 88 of the first and second support plates 81, 82, the guide members 88 are not necessarily required. That is, the holder 5 may be directly supported by the first and second support plates 81 via the openings 84a, 82a formed therein. Alternatively, protrusions may be provided in the coupling member 7, and the protrusions may be supported by the guide holes 88a or the guide grooves 85a, 86a of the support body 8. Guide holes or guide grooves extending in the biasing direction may be formed in the coupling member 7 and the actuator main body 4, and engaging portions configured to engage with the guide holes or the guide grooves may be provided in the support body 8. That is, any configuration may be used as long as the ultrasonic actuator 2 can be supported so as to be displaceable in the biasing direction.

The above embodiment is described with respect to the configuration in which the ultrasonic actuator 2 drives the columnar movable body 11. However, the present embodiment can be used in configurations for driving various objects. For example, the present embodiment may be configured to drive a lens frame of a camera by the ultrasonic actuator 2. In this case, the movable body 11 is provided integrally with the lens frame, and the lens frame is configured to be movable along the shaft 10. The present embodiment may be configured to drive such a lens frame by the ultrasonic actuator 2.

In the above embodiment, the roller 6 is provided on the opposite side of the movable body 11 from the actuator main body 4. However, a member (i.e., an opposing member) located on the opposite side from the actuator main body 4 is not limited to the roller 6. For example, the opposing member may be a roller having a roller main body non-rotatably attached to a roller shaft. The opposing member may be a contact member that merely contacts the movable body 11. In this case, the contact member may be provided either separately from or integrally with the coupling member 7. Note that it is preferable that the contact member have low frictional resistance with respect to the movable body 11. The opposing member may be another actuator main body. In this case, the movable body 11 is held between the two actuator main bodies. That is, the movable body 11 is driven by the two actuator main bodies. Any member may be used as the opposing member as long as it contacts the movable body 11 and is positioned so as to face the actuator main body 4 with the movable body 11 interposed therebetween.

A coupling structure for coupling the actuator main body 4 with the opposing member (the roller 6 in the present embodiment) located on the opposite side from the actuator main body 4 is not limited to the configuration using the coupling member 7. Any configuration may be used as long as it couples the actuator main body 4 with the opposing member, and biases the actuator main body 4 and the opposing member so as to sandwich the movable body 11 therebetween with the movable body kept displaceable along the shaft.

The shape of the main body 11*a* of the movable body 11 is not limited to that described in the above embodiment, and the main body 11*a* may have any shape.

The following configuration may be used to reduce deformation of the bearing portions 15.

Although the actuator main body 4 is coupled with the roller 6 by the coupling member 7, and the movable body 11 is held between the actuator main body 4 and the roller 6 in the above embodiment, the present invention is not limited to this. Any configuration may be used as long as the actuator main body 4 is biased to contact the movable body 11, and the roller 6 and the coupling member 7 may be omitted.

Although the bearing portions 15 are provided at the ends of the through hole 11*b* of the main body 11*a* of the movable body 11 in the present embodiment, the bearing portion 15 may be provided along the entire length of the through hole 11*b*.

One or both of the first and second slide plates 13, 14 may be omitted.

The materials of the main body 11*a* of the movable body 11 and the bearing portions 15 are not limited to those described in the above embodiment, and any materials may be used as long as the elastic modulus of the bearing portions 15 is higher than that of the main body 11*a*. The material of the first and second slide plates 13, 14 is not limited to that described in the above embodiment. Although any material can be used for the first and second slide plates 13, 14, it is preferable to use a material having a greater elastic modulus than that of the main body 11*a*.

As described above, the technique disclosed herein is useful for drive units including a vibratory actuator and a support body configured to support the vibratory actuator. The technique disclosed herein is also useful for drive units configured to drive a movable body, which is supported by a shaft, by using a vibratory actuator.

Note that the above embodiments are essentially preferred examples, and are not intended to limit the invention, its applications, and the range of its uses. The present invention is not limited to the above embodiments, and may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes and modifications which come within the meaning and range of equivalency of the claims are to be embraced within their scope.

What is claimed is:

1. A drive unit, comprising:
a shaft;
a movable body supported by the shaft so as to be displaceable along the shaft;
a vibratory actuator configured to drive the movable body; and
a support body configured to support the vibrator actuator, wherein
the vibratory actuator includes an actuator main body that contacts the movable body and is configured to vibrate to output a driving force to the movable body, an opposing member that contacts the movable body and is positioned so as to face the actuator main body with the movable body interposed therebetween, and a coupling member that is configured to couple the actuator main body with the opposing member and to bias the actuator main body and the opposing member so as to sandwich the movable body therebetween with the movable body kept displaceable along the shaft, and
the support body supports the vibratory actuator so that the vibratory actuator is displaceable along a biasing direction of the coupling member.

2. The drive unit of claim 1, wherein
the support body supports the vibratory actuator so that the vibratory actuator is displaceable along a direction perpendicular to both an axial direction of the shaft and the biasing direction of the coupling member.

3. The drive unit of claim 1, wherein
the support body supports the vibratory actuator so that the vibratory actuator is displaceable about an axis of the shaft.

4. The drive unit of claim 1, wherein
the support body supports the vibratory actuator so that the vibratory actuator is displaceable about an axis extending along a direction perpendicular to both an axial direction of the shaft and the biasing direction of the coupling member.

5. The drive unit of claim 1, wherein
the actuator main body and the opposing member contact the movable body so as to be displaceable in a plane perpendicular to the biasing direction.

6. The drive unit of claim 1, wherein
one of the support body and the vibratory actuator is provided with a guide portion having a long hole or a groove extending in the biasing direction,
the other of the support body and the vibratory actuator is provided with an engaging portion configured to fit in the long hole or the groove of the guide portion, and
the vibratory actuator is displaceable along the long hole or the groove of the guide portion with respect to the support body.

7. The drive unit of claim 6, wherein
the engaging portion fits in the long hole or the groove of the guide portion so as to be displaceable along a direction perpendicular to both an axial direction of the shaft and the biasing direction of the coupling member.

8. The drive unit of claim 6, wherein
the engaging portion and the guide portion are provided in the actuator main body and the support body, and are also provided in the opposing member and the support body.

9. A drive unit, comprising:
a shaft;
a movable body supported by the shaft so as to be displaceable along the shaft; and
a vibratory actuator including an actuator main body that is configured to be biased so as to contact the movable body, and is configured to vibrate to output a driving force to the movable body, wherein
the movable body includes a main body having a through hole formed therein, and a bearing portion provided at least at an end of the through hole and configured to receive the shaft therethrough, and the bearing portion has a higher elastic modulus than the main body of the movable body.

10. The drive unit of claim 9, wherein the vibratory actuator further includes an opposing member that contacts the movable body and is positioned so as to face the actuator main body with the movable body interposed therebetween, and a coupling member that is configured to couple the actuator main body with the opposing member and to bias the actuator main body and the opposing member so as to sandwich the movable body therebetween with the movable body kept displaceable along the shaft.

11. The drive unit of claim 10, further comprising:

a support body configured to support the vibratory actuator so that the vibratory actuator is displaceable along a biasing direction of the coupling member.

12. The drive unit of claim 10, wherein the movable body further includes a first slide member provided on a portion of the main body of the movable body, which contacts the actuator main body, and the first slide member has a higher elastic modulus than the main body of the movable body.

13. The drive unit of claim 10, the movable body further includes a second slide member provided on a portion of the main body of the movable body, which contacts the opposing member, and the second slide member has a higher elastic modulus than the main body of the movable body.

* * * * *